United States Patent [19]

Tsukada et al.

[11] 4,025,348

[45] May 24, 1977

[54] PHOTOSENSITIVE RESIN COMPOSITIONS

[75] Inventors: Katsushige Tsukada; Asao Isobe; Toshiaki Ishimaru; Nobuyuki Hayashi; Masahiro Abo, all of Hitachi, Japan

[73] Assignee: Hitachi Chemical Company, Ltd., Japan

[22] Filed: May 5, 1975

[21] Appl. No.: 574,452

[30] Foreign Application Priority Data

| May 10, 1974 | Japan | 49-51111 |
| May 10, 1974 | Japan | 49-51112 |
| May 10, 1974 | Japan | 49-51113 |

[52] U.S. Cl. .................. 96/115 R; 96/115 P; 204/159.15; 260/77.5 CR; 260/836; 260/837 R

[51] Int. Cl.$^2$ .................. G03C 1/68; G08F 8/00; G08L 61/06

[58] Field of Search ............ 96/115 R, 115 P; 204/159.15; 260/836, 837, 77.5 CR

[56] References Cited

UNITED STATES PATENTS

| 3,380,831 | 4/1968 | Cohen et al. | 96/115 R |
| 3,486,903 | 12/1969 | Henkler et al. | 96/115 R |
| 3,796,578 | 3/1974 | Hosoi et al. | 96/115 R |
| 3,859,098 | 1/1975 | Iwama et al. | 96/115 R |
| 3,861,917 | 1/1975 | Magnotta et al. | 96/115 R |
| 3,881,935 | 5/1975 | Apellaniz | 96/115 R |
| 3,895,952 | 7/1975 | Schlesinger | 96/115 R |

*Primary Examiner*—Jack P. Brammer
*Attorney, Agent, or Firm*—Craig & Antonelli

[57] ABSTRACT

A photosensitive resin composition consisting essentially of (A) a photo-polymerizable unsaturated compound having at least two terminal ethylene groups, (B) a reactive linear high molecular weight compound having in its side chain one or two functional groups selected from the class consisting of tetrahydrofurfuryl group and N-alkoxymethylcarbamoyl group, (C) a sensitizer capable of initiating polymerization of the above unsaturated compound upon irradiation with active rays, (D) a compound having at least two epoxy groups, and (E) a potential or latent curing agent for epoxy resins. The photosensitive resin composition can give a protective film excellent in solvent resistance, chemical resistance, heat resistance and mechanical strengths, and hence can be used in the production of printed circuit boards and the precision-processing of metals.

20 Claims, No Drawings

PHOTOSENSITIVE RESIN COMPOSITIONS

This invention relates to a photosensitive resin composition. More particularly, this invention pertains to a photosensitive resin composition for the formation of a protective film having excellent properties which can be used in the production of printed circuit boards, the precision-processing of metals, etc.

In the precision-processing industry, for example, in the production of a printed circuit board, it has heretofore been well known to use a photosensitive resin to form a protective film for metal plating and etching. Conventional photosensitive resins are (1) system of polyvinyl alcohol, gelatine and bichromate, and (2) system of polyvinyl cinnamate. Recently, a photo-polymerizable resin system has begun to be used in addition to the above two systems. This system is inexpensive as in the above system (1) and has storage stability and a high resolving power as the above system (2) has. In addition, the tolerance of film thickness is great and processing is easy. Therefore, the photo-polymerizable resin system can be supplied in the form of a film to users. In these respects, the photo-polymerizable resin system is excellent. However, the photosensitive resins which have heretofore been known, including the photo-polymerizable resins, have problems to be solved.

Thus, the protective film obtained from these systems is insufficient in solvent resistance, chemical resistance, heat resistance, and mechanical strengths, and hence is limited in application field. For example, said film is resistant to neutral or weakly acidic solutions, but is not resistant to strongly acidic or alkaline solutions. Therefore, there are some limitations with respect to treating agents for etching, metal plating, etc. of said film. Also, said film is not resistant to aromatic hydrocarbons such as toluene and the like, chlorinated hydrocarbons such as trichloroethylene and the like, and ketones such as methyl ethyl ketone, and is insufficient in mechanical strengths and heat resistance, and hence cannot be used as a permanent protective film. These are the reasons why the above photosensitive resins have not been employed in the field wherein an epoxy resin screen printing system such as resist for non-electrolytic copper plating, solder resist and the like has hitherto been used.

In view of the above circumstances, the present inventors made extensive researches to achieve this invention.

An object of this invention is to provide a photosensitive resin composition for forming a protective film excellent in solvent resistance, chemical resistance, heat resistance and mechanical strengths.

According to this invention, there is provided a photosensitive resin composition consisting essentially of (A) a photo-polymerizable unsaturated compound having at least two terminal ethylene groups, (B) a reactive linear high molecular weight compound having in its side chain one or two functional groups selected from the class consisting of tetrahydrofurfuryl group and N-alkoxymethylcarbamoyl group, (C) a sensitizer capable of initiating polymerization of the above unsaturated compound upon irradiation with active rays, (D) a compound having at least two epoxy groups, and (E) a potential or latent curing agent for epoxy resins.

The respective components for constructing the photosensitive resin composition of the present invention will be explained below in detail.

The photosensitive resin composition of this invention must contain a photo-polymerizable unsaturated compound having at least two terminal ethylene groups. This compound includes, for example, polyhydric alcohol acrylates and methacrylates, and preferable examples thereof are acrylates and methacrylates of ethylene glycol, triethylene glycol, tetraethylene glycol, propylene glycol, trimethylolpropane, pentaerythritol, neopentyl glycol and the like. Further, acrylates and methacrylates derived from modified bisphenol A such as reaction product of acrylic acid or methacrylic acid with a bisphenol A-epichlorohydrin epoxy resin prepolymer and acrylates and methacrylates of alkylene oxide adduct of bisphenol A or its hydrogenetion product may be used. In addition to these esters, methylene-bis-acrylamide, methylene-bis-methacrylamide, and bis-acryl- and bis-methacryl-amides of diamines such as ethylenediamine, propylenediamine, butylenediamine, pentamethylenediamine, etc. are useful as the photo-polymerizable unsaturated compound. Furthermore, reaction products of diol monoacrylate or diol methacrylate with diisocyanate and triacryl formal or triallyl cyanurate are also suitable. Besides these monomeric compounds, there may be used linear high molecular weight compounds containing acryloyloxy or methacryloyloxy group in their side chain, for example, a ring-opening copolymerization product of glycidyl methacrylate or addition reaction products of acrylic or methacrylic acid with copolymerization product of glycidyl methacrylate with a vinyl compound. The amount of the photo-polymerizable unsaturated compound used is 10 to 90% by weight, and preferably 15 to 60% by weight, based on the weight of the photosensitive resin composition.

The second essential component of the photosensitive resin composition of this invention is a reactive linear high molecular weight compound having in its side chain one or two functional groups selected from the class consisting of tetrahydrofurfuryl group and N-alkoxymethylcarbamoyl group. Such a reactive linear high molecular weight compound can be easily produced by polymerization using as an essential component at least one unsaturated compound selected from the group consisting of unsaturated compounds represented by the formulas,

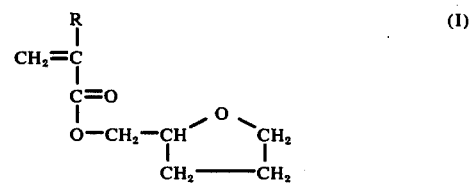

wherein R is hydrogen or an alkyl group such as methyl or ethyl, or

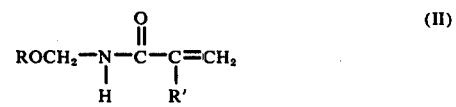

wherein R is hydrogen or an alkyl group and R' is hydrogen, an alkyl group, nitrile group or a halogen. The alkyl group includes methyl, ethyl, propyl, isopropyl, n-butyl, sec-butyl, etc. The content of the whole functional groups in the reactive linear high molecular weight compound is 0.003 to 0.7 mole per 100 g, and usually 0.035 to 0.21 mole per 100 g.

Examples of a suitable reactive linear high molecular weight compound include N-n-butoxymethylacrylamide-tetrahydrofurfuryl methacrylate copolymer, N-ethoxymethylacrylamide-tetrahydrofurfuryl methacrylate-methyl methacrylate copolymer, N-methoxymethylacrylamide-tetrahydrofurfuryl methacrylatestyrene copolymer, N-n-butoxymethylmethacrylamide-tetrahydrofurfuryl methacrylate-acrylonitrile copolymer, N-n-butoxymethylacrylamide-tetrahydrofurfuryl methacrylate-styrene-acrylonitrile copolymer, N-n-butoxymethylacrylamide-methyl methacrylate copolymer, N-n-propoxyacrylamide-methyl methacrylate copolymer, N-n-butoxymethylmethacrylamide-ethyl methacrylate copolymer, N-n-butoxymethylacrylamide-acrylonitrile-styrene-methyl methacrylate copolymer, tetrahydrofurfuryl acrylate polymer, tetrahydrofurfuryl methacrylate polymer, tetrahydrofurfuryl acrylatevinyl compound copolymer, tetrahydrofurfuryl methacrylate-vinyl compound copolymer, etc.

The amount of the reactive linear high molecular weight compound used is 10 to 80% by weight, and usually 20 to 70% by weight, based on the weight of photosensitive resin composition.

The third essential component of the photosensitive resin composition of the present invention is a sensitizer capable of initiating polymerization of the photopolymerizable unsaturated compound upon irradiation with active rays. Preferable sensitizers are benzophenone, Michler's ketone, benzoin, benzoin alkyl ethers, anthraquinone, alkyl-substituted anthraquinones, benzil, etc. The amount of the sensitizer used is 0.1 to 15% by weight, and preferably 1 to 10% by weight, based on the weight of the photosensitive resin composition.

The photosensitive resin composition of this invention contains further a compound having at least two epoxy groups as an essential component. Suitable compounds are so-called epoxy resin prepolymers such as Epikote 828, Epikote 871, Epikote 1001, Epikote 1004, Epikote 1007 (these are trademarks of Shell Co.), Araldite ECN-1280, Araldite ECN-1273 (these are trademarks of Ciba Co.), DEN-431, DEN-438 (these are trademarks of Dow Co.) and Chissonox 221 and Chissonox 289 (these are trademarks of Chisso Co.). Vinyl copolymerization products of glycidyl methacrylate may also be used. These may be used alone or in admixture. The amount of the compound used is 5 to 80% by weight, and usually 5 to 50% by weight.

The photosensitive resin composition of this invention contains further a curing agent for epoxy resins. Suitable curing agents are known as so-called potential or latent curing agents. Examples thereof include boron trifluoride-amine complexes such as boron trifluoride-monoethylamine complex and benzylamineboron trifluoride complex, amine tetrafluoroborates such as monoethylamine tetrafluoroborate and benzylamine tetrafluoroborate, diacid hydrazides such as adipic acid hydrazide, alkylamine boranes such as triethylamine borane, aromatic amine-inorganic acid complexes such as phenylenediamine-zinc bromide complex, extra-coordination silicates such as benzyldimethylammonium-phenylsiliconate, dicyandiamide, N,N-diallylmelamine, etc.

Also, curing agents having a long pot life at room temperature, for example, aromatic amines such as p,p'-diaminodiphenylmethane, p,p'-diaminodiphenylether and p,p'-diaminodiphenylsulfon and imidazole curing agents such as Curezole 2E4MZ (trademark for 2-ethyl-4-methylimidazole manufactured by Shikoku Kasei K.K.) and Curezole $C_{11}Z$ (trademark for 2-undecylimidazole manufactured by Skikoku Kasei K.K.) may be used. The amount of the curing agent used is 0.1 to 20% by weight, and usually 0.2 to 12% by weight, based on the weight of the photosensitive resin composition.

In addition to the above-mentioned components, the photosensitive resin composition of this invention may contain auxiliary components for various purposes, such as a thermal polymerization inhibitor for storage stability and a plasticizer for improving the properties of a film produced therefrom such as triethylene glycol diacetate and dioctyl phthalate. Further, dyes, pigments and fillers may be added to the composition. The selection of these auxiliary components may be made in the same consideration as in the production of conventional photosensitive resin compositions.

The photosensitive resin composition of this invention has the same sensitivity as conventional photosensitive resin compositions, is sufficiently stable to heat at a temperature of 80° C or lower, and can be formed into a protective film in a conventional manner.

The photosensitive resin composition of this invention is usually dissolved in an organic solvent such as methyl ethyl ketone, toluene, methyl cellosolve and chloroform so that the concentration may be 3 to 80% by weight, to prepare a sensitive solution, and this solution is then applied to a base plate to be protected by the following methods (1) or (2) to form a sensitive layer on the plate:

1. The sensitive solution is coated on the base plate and then dried.
2. The sensitive solution is coated on such a film as polyethylene terephthalate film, and then dried. The resulting coated film is adhered to the base plate by use of a hot roll.

The sensitive layer is exposed to active rays corresponding to a desired image pattern through a negative mask to cure the exposed parts of the layer, and then subjected to development with a solvent such as 1,1,1-trichloroethane to dissolve off the unexposed parts of the layer. The thus obtained protective film corresponding to the image pattern acts as a corrosion resistant film in conventional etching, metal plating or the like. An excellent strength can be given to the above film by subjecting the film to heat treatment at a temperature of 80° to 300° C, and usually 100° to 170° C, for a period of 15 minutes to 24 hours. The thus heat-treated protective film is resistant to aromatic hydrocarbons such as toluene, ketones such as methyl ethyl ketone and halogenated hydrocarbons such as ethylene dichloride, and also sufficiently resistant to strongly acidic or alkaline aqueous solutions. Further, it is excellent in heat resistance and mechanical strengths, and hence it can be used as permanent protective film for solder resist or the like.

Since the photosensitive resin composition of this invention has an excellent sensitivity and excellent chemical and physical properties, it can be employed as a photosensitive adhesive, a plastic relief or a material for printing plate.

This invention is further explained in detail by referring to Examples, which are not by way of limitation but by way of illustration. In the Examples, all parts and percentages are expressed by weight unless otherwise indicated.

EXAMPLE 1

| | | |
|---|---|---|
| Tetrahydrofurfuryl methacrylate-N-n-butoxymethylacrylamide-methyl methacrylate copolymer (20/5/75 weight ratio) | 40 | parts |
| Pentaerythritol triacrylate | 30 | parts |
| Epoxy resin (ECN-1280 manufactured by Ciba Co.) | 25 | parts |
| Boron trifluoride-monoethyl-amine complex | 2.5 | parts |
| Benzophenone | 2.7 | parts |
| Michler's ketone | 0.3 | part |
| p-Methoxyphenol | 0.6 | part |
| Methyl ethyl ketone | 200 | parts |

A photosensitive resin composition of the above recipe was prepared, applied to a copper-clad laminated plate, and dried at room temperature for 10 minutes and at 80° C for 10 minutes to form a sensitive layer of $20\mu$ in thickness. The sensitive layer was irradiated with rays through a negative mask from a 3 kW super-high pressure mercury lamp manufactured by Orc Seisakusho at an intensity of $4000\mu W/cm^2$ for 2 minutes. Immediately after that the layer was heated at 80° C for 5 minutes and then cooled. The layer was subjected to spray-development with 1,1,1-trichloroethane for 1 minute. The thus developed layer was subjected to heat-treatment at 150° C for 2 hours to obtain a protective film having a precise image corresponding to the negative mask. This protective film did not change at all even when dipped for 10 hours in each of methyl ethyl ketone, acetone, chloroform, trichloroethylene, methanol, isopropanol, toluene, benzene, xylene and 50% aqueous sulfuric acid solution, and no cracking or whitening of the protective film was found even after the film was dipped in an aqueous sodium hydroxide solution of a pH of 12 at 70° C for 100 hours, and no peeling of the film from the copper foil was observed. After the above tests on solvent resistance and chemical resistance, the film was dipped in a solder bath at a temperature of 260° to 270° C for 2 minutes to find no change in the film. From these results, it was seen that the protective film obtained in this Example could be used satisfactorily as a resist for etching, metal plating or strongly alkaline non-electrolytic chemical plating and as a solder resist.

EXAMPLE 2

| | | |
|---|---|---|
| Tetrahydrofurfuryl acrylate-N-n-butoxymethylacrylamide-styrene-methyl methacrylate copolymer (10/20/20/50 weight ratio) | 30 | parts |
| Pentaerythritol acrylate | 15 | parts |
| Tetraethylene glycol diacrylate | 10 | parts |
| t-Butylanthraquinone | 4 | parts |
| p-Methoxyphenol | 0.6 | part |
| Epoxy resin (ECN 1280) | 40 | parts |
| Boron trifluoride-benzyl-amine complex | 4 | parts |
| Victoria Pure Blue 130 | 0.1 | part |
| Toluene | 120 | parts |
| n-Butanol | 15 | parts |
| Methyl ethyl ketone | 15 | parts |

A photosensitive resin composition of the above recipe was prepared, applied to a polyethylene terephthalate film of $25\mu$ in thickness, and dried to obtain a sensitive layer of $30\mu$ in thickness. The thus obtained sensitive layer was bonded to a copperclad laminated plate under heat and pressure by use of a hot roll. Exposure for 2 minutes, heating at 80° C for 5 minutes and development for 1 minute were carried out in the same manner as in Example 1. Finally, the resulting assembly was heated at 130° C for 4 hours. The thus obtained protective film could be used as a corrosion resistant film in conventional etching with ferric chloride, and even after the etching, could be used as a permanent protective film.

EXAMPLE 3

| | | |
|---|---|---|
| Tetrahydrofurfuryl methacrylate-N-ethoxymethylacrylamide-methyl methacrylate copolymer (5/3/92 weight ratio) | 30 | parts |
| Epoxy resin (ECN-1273 manufactured by Ciba Co.) | 40 | parts |
| Curezole $C_{11}Z$ (trademark for imidazole curing agent manufactured by Shikoku Kasei K.K.) | 1 | part |
| Pentaerythritol tetra-acrylate | 30 | parts |
| 2-Ethylanthraquinone | 3 | parts |
| p-Methoxyphenol | 0.6 | part |
| Ethyl Violet | 0.1 | part |
| Toluene | 120 | parts |
| n-Butanol | 15 | parts |
| Methyl ethyl ketone | 15 | parts |

A photosensitive resin composition was prepared according to the above recipe, and a protective film was formed in the same manner as in Example 2. The thus obtained protective film could be used satisfactorily as a resist for conventional etching, metal plating or strongly alkaline non-electrolytic chemical plating and as a solder resist.

EXAMPLE 4

| | | |
|---|---|---|
| Tetrahydrofurfuryl methacrylate-N-n-butoxymethylmethacryl-amide-methyl methacrylate copolymer (30/3/67 weight ratio) | 60 | parts |
| Trimethylolpropane tri-acrylate | 10 | parts |
| A-BPE 4 (trademark for a compound assumed to be an acrylic acid ester of an alkylene oxide adduct of bisphenol A and manufactured by Shin Nakamura Kagaku K.K.) | 10 | parts |
| Epoxy resin (Epikote 1001 manufactured by Shell Co.) | 10 | parts |
| Dicyandiamide | 1 | part |
| Benzoin methyl ether | 4 | parts |
| p-Methoxyphenol | 0.5 | part |
| Methyl ethyl ketone | 100 | parts |
| Methyl cellosolve | 50 | parts |

A photosensitive resin composition was prepared according to the above recipe, and an excellent permanent protective film was obtained in the same manner as in Example 1 except that a mixture of methyl ethyl ketone and 1,1,1-trichloroethane (10/90 weight ratio) was used as a developing solution.

EXAMPLE 5

| | | |
|---|---|---|
| Tetrahydrofurfuryl methacrylate-methyl methacrylate copolymer (20/80 weight ratio) | 40 | parts |
| Pentaerythritol triacrylate | 30 | parts |
| Epoxy resin (ECN-1280 manufactured by Ciba Co.) | 25 | parts |
| Boron trifluoride-monoethylamine complex | 2.5 | parts |
| Benzophenone | 2.7 | parts |
| Michler's ketone | 0.3 | part |
| p-Methoxyphenol | 0.6 | part |
| Methyl ethyl ketone | 200 | parts |

A photosensitive resin composition was prepared according to the above recipe, and an excellent permanent protective film was obtained in the same manner as in Example 1.

EXAMPLE 6

| | | |
|---|---|---|
| Tetrahydrofurfuryl acrylate-acrylonitrile-methyl methacrylate copolymer (20/10/70 weight ratio) | 30 | parts |
| Pentaerythritol triacrylate | 15 | parts |
| Tetraethylene glycol diacrylate (A-4G manufactured by Shin Nakamura Kagaku K.K.) | 10 | parts |
| t-Butylanthraquinone | 4 | parts |
| p-Methoxyphenol | 0.6 | part |
| Epoxy resin (ECN-1280 manufactured by Ciba Co.) | 40 | parts |
| Boron trifluoride-benzylamine complex | 4 | parts |
| Victoria Pure Blue 130 | 0.1 | part |
| Methyl ethyl ketone | 200 | parts |

A photosensitive resin composition was prepared according to the above recipe, and an excellent permanent protective film was obtained in the same manner as in Example 1.

EXAMPLE 7

| | | |
|---|---|---|
| Tetrahydrofurfuryl methacrylate-styrene-ethyl acrylate copolymer (30/30/40 weight ratio) | 50 | parts |
| Pentaerythritol triacrylate | 25 | parts |
| Epoxy resin (Epikote 828 manufactured by Shell Co.) | 20 | parts |
| Curezole $C_{11}Z$ (trademark for an imidazole curing agent manufactured by Shikoku Kasei K.K.) | 1 | part |
| 2-Ethylanthraquinone | 3 | parts |
| p-Methoxyphenol | 0.6 | part |
| Ethyl Violet | 0.1 | part |
| Methyl ethyl ketone | 160 | parts |
| Methyl cellosolve | 40 | parts |

A photosensitive resin composition was prepared according to the above recipe, and a protective film was formed in the same manner as in Example 2. The thus obtained protective film could be used satisfactorily as a resist for conventional etching, metal plating or strongly alkaline non-electrolytic chemical plating and as a solder resist.

EXAMPLE 8

| | | |
|---|---|---|
| Tetrahydrofurfuryl methacrylate polymer | 60 | parts |
| Trimethylolpropane triacrylate | 10 | parts |
| A-BPE 4 (trademark for a compound assumed to be an acrylic acid ester of an alkylene oxide adduct of bisphenol A and manufactured by Shin Nakamura Kagaku K.K.) | 10 | parts |
| Epoxy resin (Epikote 871 manufactured by Shell Co.) | 20 | parts |
| Dicyandiamide | 1 | part |
| Benzoin methyl ether | 4 | parts |
| p-Methoxyphenol | 0.5 | part |
| Benzophenone | 2 | parts |
| Michler's ketone | 1 | part |
| Methyl ethyl ketone | 160 | parts |
| Methyl Cellosolve | 40 | parts |

A photosensitive resin composition was prepared according to the above recipe, and an excellent permanent protective film was obtained in the same manner as in Example 1.

EXAMPLE 9

| | | |
|---|---|---|
| N-n-butoxymethylacrylamide-methyl methacrylate-styrene copolymer (20/60/20 weight ratio) | 60 | parts |
| Pentaerythritol triacrylate | 25 | parts |
| Epoxy resin (ECN-1280 manufactured by Ciba Co.) | 15 | parts |
| Boron trifluoride-monoethylamine complex | 1.0 | part |
| Benzophenone | 2.5 | parts |
| Michler's ketone | 0.5 | part |
| p-Methoxyphenol | 0.6 | part |
| Methyl ethyl ketone | 150 | parts |
| n-Butanol | 50 | parts |

A photosensitive resin composition was prepared according to the above recipe, and an excellent permanent protective film was obtained in the same manner as in Example 2.

EXAMPLE 10

| | | |
|---|---|---|
| N-methoxymethylacrylamide-styrene-methyl methacrylate copolymer (10/20/70 weight ratio) | 40 | parts |
| Pentaerythritol tetra-acrylate | 15 | parts |
| Tetraethylene glycol diacrylate | 10 | parts |
| p-Methoxyphenol | 0.6 | part |
| Epoxy resin (ECN-1280) | 30 | parts |
| Boron trifluoride-benzylamine complex | 3.0 | parts |
| Victoria Pure Blue 130 | 0.1 | part |
| Toluene | 120 | parts |
| n-Butanol | 30 | parts |

A photosensitive resin composition was prepared according to the above recipe, and an excellent permanent protective film was obtained in the same manner as in Example 2.

As explained above, the photosensitive resin composition of the present invention gives a protective film having excellent physical and chemical properties. Therefore, the photosensitive resin composition can be used as a soder resist or a permanent protective film in which a photosensitive resin has never been usable. Such an advantage of the photosensitive resin composition of the present invention can be accomplished by the following two indispensable requisites for the present invention:

1. Use of a photo-setting system in combination with a thermosetting system

The photosensitive resin composition of the present invention contains an epoxy resin thermosetting system in addition to a photo-setting composition. A protective film having high adhesiveness to a base material to be coated and excellent mechanical and chemical properties is formed by exposure to light, development and heating.

2. Use of a reactive polymer

As a photo-polymerizable resin composition, a system consisting of a photo-polymerizable monomer and a non-reactive polymer is known. Such a system contains a large amount of the non-reactive polymer even after exposure to light and heating. The film obtained from the system has unsatisfactory physical and chemical properties and shows only a temporary protecting action for limited etching and electrolytic plating since the film contains a large amount of the non-reactive polymer which is essentially solvent-soluble and inferior in thermal, mechanical and chemical properties.

Also, a photosensitive resin composition comprising a polymer having a polymerizable ethylenically unsaturated group in its side chain is known. (Japanese Patent Publication No. 26,869/68). However, the preparation of such a reactive polymer is very troublesome while the reactive polymer used in the present invention can be simply produced by polymerization of an easily available monomer. In case of the former, it is necessary to synthesize first a glycidyl group-containing polymer and then subject the polymer to addition reaction of an acrylic acid in the presence of a catalyst. Further, a complex operation of isolating the resulting polymer is required for removing the catalyst and the unreacted materials. According to the present inventors' follow-up, the thus obtained polymer was very unstable and easy to gel during storage.

On the other hand, the reactive polymer used in the present invention can be obtained only by polymerization without such an additional isolation operation, and is stable and does not gel during storage. The cured film obtained from the photosensitive resin composition of the present invention using such a reactive polymer is almost complete in curing and hence has excellent physical and chemical properties.

What is claimed is:

1. A photosensitive resin composition which consists essentially of the following components: (A) a photo-polymerizable unsaturated compound containing at least two terminal ethylene groups, (B) a reactive linear high molecular weight compound other than component (A) having in its side chain one or two functional groups selected from the class consisting of tetrahydrofurfuryl group and N-alkoxymethylcarbamoyl group, (C) a sensitizer capable of initiating polymerization of the unsaturated compound upon irradiation with active rays, (D) a compound other than components (A) and (B) having at least two epoxy groups, and (E) a latent curing agent for epoxy resins.

2. A photosensitive resin composition according to claim 1, wherein the photo-polymerizable unsaturated compound is an acrylic or methacrylic acid ester of a polyhydric alcohol.

3. A photosensitive resin composition according to claim 2, wherein the polyhydric alcohol is ethylene glycol, triethylene glycol, tetraethylene glycol, propylene glycol, trimethylolpropane, pentaerythritol or neopentyl glycol.

4. A photosensitive resin composition according to claim 1, wherein the photo-polymerizable unsaturated compound is an acrylic or methacrylic acid ester of an alkylene oxide adduct of bisphenol A.

5. A photosensitive resin composition according to claim 1, wherein the content of the photo-polymerizable unsaturated compound is 15 to 60% by weight based on the weight of the composition.

6. A photosensitive resin composition according to claim 1, wherein the reactive linear high molecular weight compound is a polymer of at least one monomer selected from the group consisting of monomers represented by the formulas,

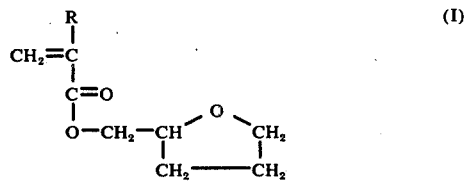

wherein R is hydrogen, methyl or ethyl, or

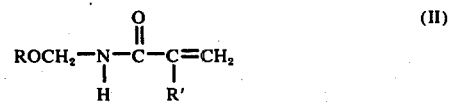

wherein R is hydrogen or a $C_{1-4}$ alkyl and R' is hydrogen, a $C_{1-4}$ alkyl, nitrile or a halogen, or a copolymer of said monomer with another vinyl monomer.

7. A photosensitive resin composition according to claim 5, wherein the content of the reactive linear high molecular weight compound is 20 to 70% by weight based on the weight of the composition.

8. A photosensitive resin composition according to claim 1, wherein the sensitizer is benzophenone, Michler's ketone, benzoin, a benzoin alkyl ether, 2-ethylanthraquinone, 3-t-butylanthraquinone or benzil.

9. A photosensitive resin composition according to claim 7, wherein the content of the sensitizer is 0.1 to 15% by weight based on the weight of the composition.

10. A photosensitive resin composition according to claim 1, wherein the compound having at least two epoxy groups is a novolac type epoxy resin prepolymer and its content is 5 to 50% by weight based on the weight of the composition.

11. A photosensitive resin composition according to claim 1, wherein the curing agent is a compound selected from the group consisting of boron trifluoride-amine complexes, amine tetrafluoroborates, dibasic acid hydrazides, alkylamine boranes, aromatic amine-inorganic acid complexes, extra-coordination silicates, dicyandiamide and N,N-diallylmelamine, and its content is 0.1 to 20% by weight based on the weight of the composition.

12. A photosensitive resin composition according to claim 1, wherein a thermal polymerization inhibitor, a plasticizer, a dye, a pigment and/or a filler is used as auxiliary components.

13. A photosensitive resin composition according to claim 1, wherein the content of the photo-polymerizable unsaturated compound is 10 to 90% by weight, the content of the reactive linear high molecular weight compound is 10–80% by weight, the content of the sensitizer is 0.1–15% by weight, the content of the compound having at least two epoxy groups is 5–80% by weight, and the content of the curing agent is from 0.2–12% by weight, said contents being based on the weight of the composition.

14. A photosensitive resin composition according to claim 1, wherein the photo-polymerizable unsaturated compound is an acrylic or methacrylic acid ester of a polyhydric alcohol; an acrylic or methacrylic acid ester of a bisphenol A-epichlorohydrin epoxy resin prepolymer; an acrylic or methacrylic acid ester of an alkylene oxide adduct of bisphenol A; methylene-bis-acrylamide, methylene-bis-methacrylamide, bis-acryl- or bis-methacryl-amide of a diamine; reaction product of diol monoacrylate or diol methacrylate with diisocyanate and triacryl formal or triallyl cyanurate; or a linear high molecular weight compound containing acryloyloxy or methacryloyloxy group in a side chain.

15. A photosensitive resin composition according to claim 1, wherein the reactive linear molecular weight compound comprises N-n-butoxymethylacrylamide-tetrahydrofurfuryl methacrylate copolymer, N-ethoxymethylacrylamide-tetrahydrofurfuryl methacrylate-methyl methacrylate copolymer, N-methoxymethylacrylamide-tetrahydrofurfuryl methacrylate-styrene copolymer, N-n-butoxymethylmethacrylamide-tetrahydrofurfuryl methacrylate-acrylonitrile copolymer, N-n-butoxymethylacrylamide-tetrahydrofurfuryl methacrylate-styrene-acrylonitrile copolymer, N-n-butoxymethylacrylamide-methyl methacrylate copolymer, N-n-propoxyacrylamide-methyl methacrylate copolymer, N-n-butoxymethylmethacrylamide-ethyl methacrylate copolymer, N-n-butoxymethylacrylamide-acrylonitrile-styrene-methyl methacrylate copolymer, tetrahydrofurfuryl acrylate polymer, tetrahydrofurfuryl methacrylate polymer, tetrahydrofurfuryl acrylate-vinyl compound copolymer, and tetrahydrofurfuryl methacrylate-vinyl compound copolymer.

16. A photosensitive resin composition according to claim 1, wherein the compound having at least two epoxy compounds is an epoxy resin prepolymer or a vinyl copolymerization product of glycidyl methacrylate.

17. A photosensitive resin composition which consists essentially of (A) a photo-polymerizable unsaturated compound containing at least two terminal ethylene groups selected from the group consisting of acrylic or methacrylic acid ester of a polyhydric alcohol; an acrylic or methacrylic acid ester of a bisphenol A-epichlorohydrin epoxy resin prepolymer; an acrylic or methacrylic acid ester of an alkylene oxide adduct of bisphenol A; methylene-bis-acrylamide, methylene-bis-methacrylamide, bis-acryl- or bis-methacryl-amide of a diamine; reaction product of diol monoacrylate or diol methacrylate with diisocyanate and triacryl formal or triallyl cyanurate; and a linear high molecular weight compound containing acryloyloxy or methacryloyloxy group in a side chain, (B) a reactive linear high molecular weight compound having in its side chain one or two functional groups selected from the class consisting of tetrahydrofurfuryl group and N-alkoxymethylcarbamoyl group comprising a polymer of at least one monomer selected from the group consisting of monomers represented by the formulae:

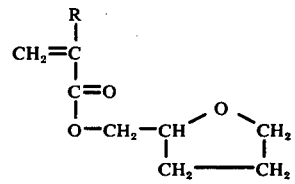

wherein R is hydrogen, methyl or ethyl, or

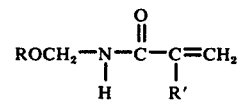

wherein R is hydrogen or a $C_{1-4}$ alkyl and R' is hydrogen, a $C_{1-4}$ alkyl, nitrile or a halogen, or a copolymer of said monomer with another vinyl monomer, (C) a synthesizer selected from the group consisting of benzophenone, Michler's ketone, benzoin, a benzoin alkyl ether, 2-ethyl-anthraquinone, 3-t-butylanthraquinone and benzil, and (D) an epoxy resin having at least two epoxy groups and (E) a latent curing agent for said epoxy resin.

18. A photosensitive resin composition according to claim 17, wherein the epoxy resin is an epoxy resin prepolymer or a vinyl copolymerization product of glycidyl methacrylate.

19. A photosensitive resin composition according to claim 18, wherein the curing agent is a compound selected from the group consisting of boron trifluoride-amine complexes, amine tetrafluoroborates, dibasic acid hydrazides, alkylamine boranes, aromatic amine-inorganic acid complexes, extra-coordination silicates, dicyandiamide and N,N-diallylmelamine.

20. A photosensitive resin composition according to claim 19, wherein the content of the photo-polymerizable unsaturated compound is 10 to 90% by weight, the content of the reactive linear high molecular weight compound is 10–80% by weight, the content of the sensitizer is 0.1–15% by weight, the content of the compound having at least two epoxy groups is 5–80% by weight, and the content of the curing agent is from 0.2–12% by weight, said contents being based on the weight of the composition.

* * * * *